United States Patent [19]

Sypek et al.

[11] Patent Number: 5,340,681
[45] Date of Patent: Aug. 23, 1994

[54] METHOD FOR PREPARING PHOTOGRAPHIC ELEMENTS HAVING SINGLE PHOTOSENSITIVE LAYER CONTAINING PHOTOPOLYMERIZABLE COMPOUND, PHOTOINITIATOR, DIAZONIUM COMPOUND AND BARRIER MATERIAL ENCAPSULATED PIGMENT PARTICLES; AND NEGATIVE IMAGE FORMATION PROCESS

[75] Inventors: Maria T. Sypek, Belchertown; Paul A. Perron, Springfield, both of Mass.; Gary V. Grosclaude, Torrington, Conn.

[73] Assignee: International Paper Company, Purchase, N.Y.

[21] Appl. No.: 148,757

[22] Filed: Nov. 5, 1993

Related U.S. Application Data

[60] Division of Ser. No. 897,319, Jun. 11, 1992, Pat. No. 5,286,594, which is a continuation-in-part of Ser. No. 560,037, Jul. 30, 1990, abandoned, which is a continuation-in-part of Ser. No. 150,194, Jan. 29, 1988, abandoned.

[51] Int. Cl.⁵ .................... G03F 7/021; G03F 7/30
[52] U.S. Cl. .................... 430/138; 430/157; 430/162; 430/168; 430/169; 430/278; 430/281; 430/284; 430/325

[58] Field of Search ............ 430/138, 157, 162, 168, 430/169, 278, 281, 284, 325

[56] References Cited

U.S. PATENT DOCUMENTS

| | | |
|---|---|---|
| 3,905,815 | 9/1975 | Bonham . |
| 4,659,645 | 4/1987 | Frommeld et al. ............ 430/175 |
| 4,687,727 | 8/1987 | Toyama et al. ............ 430/175 |
| 4,886,731 | 12/1989 | Sypek et al. ............ 430/156 |

FOREIGN PATENT DOCUMENTS 2044788A 10/1980 United Kingdom .

*Primary Examiner*—Charles L. Bowers, Jr.
*Assistant Examiner*—Christopher G. Young
*Attorney, Agent, or Firm*—Richard S. Roberts; Michael J. Doyle

[57] ABSTRACT

Photopolymeric printing plates are presented wherein and electrochemically etched and anodized, silicated aluminum substrate has a single photosensitive coating thereon composed of a photopolymerizable combination which includes a photopolymerizable pigment dispersion, a photosensitive lithographic diazonium resin, multifunctional acrylate oligomer, multifunctional acrylate monomer, photopolymerizable binder and photoinitiator to yield a non-tacky, mar resistant, easily developed durable plate. In a preferred embodiment, an additional aqueous, non-photosensitive overcoat is applied over the initial coating to retard oxygen inhibition.

23 Claims, No Drawings

METHOD FOR PREPARING PHOTOGRAPHIC ELEMENTS HAVING SINGLE PHOTOSENSITIVE LAYER CONTAINING PHOTOPOLYMERIZABLE COMPOUND, PHOTOINITIATOR, DIAZONIUM COMPOUND AND BARRIER MATERIAL ENCAPSULATED PIGMENT PARTICLES; AND NEGATIVE IMAGE FORMATION PROCESS

CROSS REFERENCE TO RELATED APPLICATIONS

This application is a division of U.S. patent application Ser. No. 07/897,319, now U.S. Pat. No. 5,280,594, filed Jun. 11, 1992, which is a continuation-in-part of U.S. patent application Ser. No. 07/560,037 filed Jul. 30, 1990 which was a continuation-in-part of U.S. patent application Ser. No. 07/150,194 filed Jan. 29, 1988, now abandoned.

BACKGROUND OF THE INVENTION

This invention relates to printing plates. More particularly, this invention relates to photopolymeric printing plates having a single photosensitive coating thereon composed of a photopolymerizable combination which includes a photopolymerizable pigment dispersion and a photosensitive lithographic diazonium resin and which is particularly well suited as a lithographic printing plate.

In lithographic printing plate technology, photosensitive compositions coated onto plates are needed which have desirable properties and which have substantially distinct physical characteristics before and after they are exposed to actinic radiation. The coated plate should be stable through time (i.e., not subject to changes in photospeed or ease of development) and should be non-tacky and mar resistant. The cured composition must be tough, resistant to solvents, and oleophilic. These are difficult properties to combine into one coating. This is especially so when the coating is applied to an electrochemically etched and anodized silicated aluminum substrate.

Patents describing lithographic printing plates utilizing a single, free radical photopolymerizable, organophilic layer which directly overlies the base sheet include, for example, U.S. Pat. Nos. 2,760,863; 3,468,311; 3,475,171; 3,512,971; 3,516,828; and 3,549,367. However, such known photopolymerizable layers characteristically provide poor adhesion (upon exposure and polymerization) to permanently hydrophilic, passivated substrates, such as silicated aluminum.

It will be appreciated that prior attempts have been made to obtain the above desirable properties by using multiple photosensitive coatings (generally two), on anodized aluminum substrates. For example, Larson U.S. Pat. No. 3,136,637 combines a first coating of diazo resin with a second overlayer of an organophilic resin. Thomas U.S. Pat. No. 3,808,004 combines a first coating of diazo resin with a second overlayer of a phenoxy cinnamate photopolymer. Bonham U.S. Pat. No. 3,905,815 comprises a base sheet bearing a thin layer of a water soluble, light sensitive diazo over which is provided a photopolymerizable layer.

Golda U.S. Pat. No. 4,104,072 produces a water developable plate by coating a first layer of a water soluble, light sensitive substance and a second overlayer of a water insoluble, ink receptive, photosensitive resin composition. Patrellis et al. U.S. Pat. No. 4,316,949 discloses a long running printing plate having a first layer of an oligomeric diazonium resin and a second overcoat comprising an oligomer, polymeric binder, solvent soluble photosensitive oligomeric diazonium resin, and a free-radical photoinitiator system. Asano U.S. Pat. No. 4,588,669 discloses a printing plate comprising a photosensitive diazo layer on the substrate and a second overlayer of a photoreactive polyvinyl acetal resin containing an aromatic azide group.

Commonly assigned U.S. Pat. No. 4,886,731 the disclosure of which is incorporated herein by reference describes a photopolymeric plate comprising three photosensitive layers where a first layer of a water-soluble, light sensitive lithographic diazonium is coated with two additional layers each containing a solvent soluble light sensitive diazonium and photopolymerizable components.

Although the use of multiple photosensitive layers provides means for achieving some of the properties in a desired lithographic plate made on a silicated substrate, several disadvantages still remain. These disadvantages include at least the following:

1. Multiple coatings require more sophisticated and complex manufacturing techniques.

2. Normally a water soluble diazo is coated first since the other overlayers are generally coated from a solvent. Water based diazo coatings (even when overcoated) tend to be less stable on silicated substrates then solvent soluble photosensitive coatings coated on the same silicated substrates.

3. Aqueous based developers are difficult to use on multiple coated plates unless the upper layer is permeated by the developer. However, if water tends to permeate the unexposed plate, then the first layer aqueous diazo coating is subject to degradation by atmospheric shelf life conditions. This again reduces the plate stability.

4. Very durable printing plates are difficult to prepare with a multiple coated silicated, grained and anodized plate, since adhesion between the several layers is crucial. It is preferable, especially with photopolymer type plates, to coat the photopolymer composition directly into the silicated, anodized grain on the aluminum.

5. The reproduction quality of plates produced with multiple photosensitive coatings can be poor unless the photospeed to each layer is properly matched. This can be difficult to achieve without compromising other plate qualities and difficult to maintain under normal manufacturing circumstances.

SUMMARY OF THE INVENTION

The above discussed and other problems and deficiencies are overcome or alleviated by the photopolymeric printing plate of the present invention. In accordance with the present invention, a photopolymeric printing plate which is non-tacky, mar resistant and stable prior to exposure is provided having a single photosensitive coating comprising a photopolymerizable combination which includes a photopolymerizable pigment dispersion and a photosensitive lithographic diazonium resin. After exposure the plate is solvent and chemical resistant, very durable and easily developed with aqueous-based developers which do not require harsh, toxic solvents. A second, aqueous, non-photosensitive coating may be applied to the plate to retard the inhibition of photopolymerization by atmospheric oxygen.

The invention provides a light sensitive, photopolymerizable composition which comprises an admixture of:

a.) a substantially homogeneous pigment composition, which pigment composition comprises pigment particles which are substantially pre-encapsulated by a barrier material, which barrier material comprises one or more photopolymerizable monomer, oligomer or polymer components capable of being photopolymerized and which resists de-encapsulation when in admixture with the other components of the photosensitive composition, said pigment composition being present in an amount sufficient to substantially uniformly color the photosensitive composition; and b.) at least one photopolymerizable monomer, oligomer or polymer binder in an amount sufficient to form a substantially uniform photopolymerizable composition; and c.) at least one photoinitiator in an amount sufficient to effect photopolymerization of the barrier material and the photopolymerizable monomer, oligomer or polymer binder upon exposure to sufficient actinic radiation; and d.) at least one diazonium compound in an amount sufficient to form a light sensitive composition.

The invention also provides a photographic element comprising this light sensitive, photopolymerizable composition disposed on a substrate.

The invention further provides a process for preparing a photopolymerizable composition which comprises:

a.) forming a substantially homogeneous pigment composition, by substantially pre-encapsulating pigment particles with a barrier material, which barrier material comprises one or more photopolymerizable monomer, oligomer or polymer components capable of being photopolymerized; and b.) admixing said pigment composition with:

i.) at least one photopolymerizable monomer, oligomer or polymer binder in an amount sufficient to form a substantially uniform photopolymerizable composition; and ii.) at least one photoinitiator in an amount sufficient to effect photopolymerization of the barrier material and the photopolymerizable monomer, oligomer or polymer binder upon exposure to sufficient actinic radiation; and iii.) at least one diazonium compound in an amount sufficient to form a light sensitive composition;

said pigment composition being present in an amount sufficient to color the photosensitive composition; and wherein said admixing is conducted under conditions to achieve substantial resistance to de-encapsulation of the pigment particles by the barrier material.

The invention further pertains to a lithographic printing plate comprising an aluminum substrate having a silicate coating on at least one surface thereof, said silicate coatings have an additional single photosensitive coating comprising a photopolymerizable composition applied directly thereto, said additional coating comprising; between about 0.1% and about 20% by weight, at least one photopolymerizable pigment dispersion homogeneously dispersed in said single photosensitive coating and; between about 0.05% and about 10% by weight, at least one photosensitive lithographic diazonium resin; The invention still further pertains to a method of making a lithographic printing plate comprising the steps of providing a silicate coating to at least one surface of an aluminum substrate; providing an additional single photosensitive coating comprising a photopolymerizable composition to said silicate coating, said additional coating comprising between about 0.1% and about 20%, by weight, at least one photopolymerizable pigment dispersion homogeneously dispersed in said additional coating; and between about 0.05% and about 10% by weight, at least one photosensitive lithographic diazonium resin.

DETAILED DESCRIPTION OF THE INVENTION

The present invention relates to photographic elements, particularly photopolymeric printing plates wherein, a substrate preferably, an electrochemically etched and anodized, silicated aluminum plate, has a single photosensitive coating compromising a photopolymerizable combination which includes a photopolymerizable pigment dispersion and a photosensitive lithographic diazonium resin. In a first embodiment of the present invention, the photopolymeric printing plate includes only a single photosensitive coating comprising a photopolymerizable combination which includes a homogeneously dispersed photopolymerizable pigment dispersion and a photosensitive lithographic diazonium resin on the electrochemically etched and anodized, silicated aluminum plate. This single photosensitive coating most preferably includes the following components:

(1) photopolymerizable pigment dispersion;
(2) photosensitive lithographic diazonium resin;
(3) multi-functional acrylate oligomer;
(4) multi-functional acrylate monomer;
(5) photopolymerizable binder; and
(6) photoinitiator. Such a plate is non-tacky, mar resistant and stable prior to exposure. Following the imagewise exposure to actinic radiation, the photosensitive single coating which has not been exposed is easily removed from the electrochemically etched and anodized, silicated aluminum substrate, while the photosensitive single coating which has been exposed is firmly bonded to the substrate, solvent-resistant and very durable.

Such photopolymerizable printing plates having a single photosensitive coating including a photosensitive lithographic diazonium resin were achieved when the use of a photopolymerizable pigment dispersion in the coating was discovered. The role of the photopolymerizable pigment dispersion will be explained in the following paragraphs.

Pigments, both organic and inorganic are commonly used to impart color to coatings. Color is a desired characteristic of a photosensitive coating for printing plates. The color allows inspection of the printing plate for coating defects and uniformity of the coating before use. After the plate is imagewise exposed and the unexposed coating is removed by development, color in the exposed coating remaining on the plate provides visible discrimination between exposed, imaged areas of the plate and the unexposed, non-imaged areas of the plates.

Pigment dispersions are commonly employed to color photosensitive coatings for printing plates. To obtain the level of color necessary in a printing plate, pigment dispersions are used in quantities which represent a significant portion of the photosensitive composition used to coat the printing plate.

In order to achieve maximum color and color uniformity in the coating, pigments are dispersed or ground to reduce the particle size of the pigment to a uniform, primary size characteristic of the pigment.

However, when a pigment alone is dispersed, the uniform dispersion of primary sized pigment particles is unstable as the attractive cohesion forces of the pigment particles for other pigment particles will cause them to recombine or agglomerate. Such a pigment dispersion, when used in a coating, will not provide maximum, uniform color to the coating. Also, the pigment will not remain homogeneously dispersed in the coating, but rather tends to settle out. Such a pigmented coating is of little use.

To overcome these problems, an additional material, a dispersant, is added to the pigment as the pigment is ground or dispersed. The dispersant surrounds or encapsulates the uniform primary sized pigment particles and acts as a barrier to prevent the pigment particles from recombining or agglomerating. In order for the dispersant to function, it must be bound to the pigment particle, usually through hydrogen bonding or Van der Waals forces, so that the pigment dispersion consists of a primary sized pigment particles surrounded or encapsulated by bound dispersant. When added to a coating this binding of the pigment particle and dispersant must be maintained. If the dispersant becomes detached from the pigment particle in the coating, the pigment particles will tend to recombine or agglomerate, leading to loss of color, color uniformity, and settling of the pigment. When the dispersant and pigment particle remain bound, color and color uniformity are maintained as the distribution of the pigment dispersion is homogeneous throughout the coating.

When pigment dispersions prepared with a non-photopolymerizable dispersant are employed to color a photopolymerizable printing plate coating, the pigment dispersion is inert with respect to the photopolymerization reaction. Therefore, no photopolymerization occurs in the areas of the photopolymerizable coating occupied by the pigment dispersion, creating disruptions in the photopolymer. These disruptions will weaken the photopolymer formed, effecting the solvent resistance and durability of the photopolymeric printing plate. This problem can be overcome by the use of large amounts of multifunctional monomer in the photopolymer composition. These multifunctional monomers can form highly crosslinked photopolymer networks which effectively form "cages" around the pigment dispersion reducing the effects of the disruptions caused by the pigment dispersion on the photopolymer. These multifunctional monomers typically are high boiling liquids and the use of large amounts of these monomers make the formulation of a single layer photopolymerizable coating which is non-tacky and mar resistant before exposure virtually impossible. Also, the use of large amounts of such multifunctional liquid monomers will result in a relatively mobile photopolymerizable coating on the printing plate substrate. Such mobility of the coating, in particular when the photopolymerizable coating also includes a photosensitive lithographic diazonium resin, leads to decreased stability of the printing plate prior to imagewise exposure, effecting the response of the plate to actinic radiation and the ease of removal of the unexposed coating from the plate during development. Thusly, when a pigment dispersion prepared with a non-photopolymerizable dispersant is employed to color a single layered photopolymerizable printing plate coating containing a photosensitive lithographic diazonium, a compromise between a non-tacky, mar resistant, stable printing plate prior to exposure and a solvent-resistant, durable plate after exposure is unavoidable.

Commonly assigned U.S. Pat. No. 4,886,731 describes a photopolymerizable printing plate colored with pigment dispersions prepared with non-photopolymerizable dispersants where such a compromise is avoided through the use of three photosensitive coatings.

According to the present invention, however, when pigment dispersions prepared with a photopolymerizable dispersants are employed to color a photopolymerizable printing plate coating, the pigment dispersion now participates in the photopolymerization reaction. The pigment dispersion becomes an integral part of the photopolymer formed during exposure. The photopolymerized pigment dispersion strengthens the photopolymer formed, improving solvent resistance and durability. The amount of multifunctional monomer need to produce a solvent resistant, durable photopolymer printing plate is reduced, making the formulation of a single layered non-tacky, mar resistant coating before exposure relatively simple. Also, since the amount of multifunctional monomer is reduced, the mobility of the coating before exposure is reduced, improving the stability of a single layered photopolymerizable printing plate coating which also contains a photosensitive lithographic diazonium resin.

The photopolymerizable pigment dispersion comprises an organic or inorganic pigment dispersed in a photopolymerizable dispersant or a combination of photopolymerizable and non-photopolymerizable dispersants. Examples of suitable pigments include but are not limited to perylene maroon, phthalo cyanine blue, phthalo cyanine green, cadmium red and will comprise 20 to 80% of the pigment dispersion, preferably 40 to 60%. Examples of suitable photopolymerizable dispersants include acrylated epoxies, acrylated polyurethanes, acrylated esters and polyesters, acrylated polyvinylbutyral, acrylamido substituted polyvinylbutyral and acrylamido substituted cellulose esters but are not limited to these examples. These same photopolymerizable dispersants may be used in combination with a non-photopolymerizable dispersant. Examples of suitable non-photopolymerizable dispersants to be used in combination with a photopolymerizable dispersant include but are not limited to polyvinylbutyral, polyvinylformal, cellulose esters, polyurethanes and epoxies. The dispersant will comprise 20 to 80% of the pigment dispersion, preferably 40 to 60%. If a combination of photopolymerizable and non-photopolymerizable dispersants are used, the ratio of photopolymerizable to non-photopolymerizable dispersant can range from 4 parts to 1 part to 1 part to 4 parts, preferably 2 parts to 1 part to 1 part to 2 parts of the total dispersant. The photopolymerizable pigment dispersion will comprise between 0.10 and 30.0% of the coating composition, preferably between 0.20 and 20.0% by weight.

Suitable photosensitive lithographic diazonium resins are isolated as the salts of the condensation product of a suitable monomeric diazonium or mixture of monomeric diazoniums with a suitable condensing agent, condensed in strong acid. Examples of suitable monomeric diazoniums include but are not limited to p-diazodiphenylamine sulfate; 3-methoxy-4-diazodiphenylamine sulfate; 4-diazo-4'-methoxydiphenylamine sulfate; 2,5-diethoxy-4-diazo-4'-thiotoluyl sulfate and combinations thereof. Examples of suitable condensing agents include but are not limited to formaldehyde; paraformaldehyde; 4,4'-bismethoxymethyldiphenylether; 4,4'-bishydroxymethyldiphenylether; 4,4'-bismethoxymethyldiphenylsulfide; 4,4'-bismethoxymethyl bisphenol A and combinations thereof. Examples of suitable condensing acids include but are not limited to sulfuric acid, phosphoric acid, trifluoromethyl sulfonic acid and nitric acid. Examples of suitable salt anions used to isolate the condensation products include but are not limited to p-toluenesulfonate, hexafluorophosphate, tetrafluoroborate, mesitylenesulfonate, and trifluoromethlysulfonate. The photosensitive lithographic diazonium resin will comprise between 0 05 and 10$^s$ preferably 0.1 to 3.0% of the total coating composition by weight.

The photopolymerizable composition contains a photopolymerizable monomer, oligomer or polymer binder present in an amount of from about 0.1% and about 60% by weight of the overall photopolymerizable composition. In the most preferred embodiment, the photopolymerizable composition contains each of a photopolymerizable monomer, oligomer and polymer binder.

Examples of suitable multifunctional acrylate oligomers include, but are not limited to acrylated epoxies (Radcure Corporation's Ebecryl 3701), acrylated polyurethanes (Sartomer Co.'s C9505), and acrylated polyesters (Henkel Corp.'s Photomer 5007). These functional acrylate oligomers will comprise between 0.10 and 20.0% of the total coating composition by weight, preferably between 0.5 and 10%.

Examples of suitable multifunctional acrylate monomers include, but are not limited to trimethylolpropane triacrylate (Sartomer Co.'s SR 351), trimethylolpropane propoxylate or ethoxylate triacrylates (Henkel Corp.'s Photomers 4072 and 4149), and pentaerythritol tetraacrylate (Sartomer Co.'s SR 295); and, have a weight percent of between 0.10 and 20.0% of the total coating composition, preferably between about 1.0 and 10%.

Examples of suitable photopolymerizable binders include, but are not limited to acrylamido substituted cellulose esters (Bomar "Jaylink" series), and high molecular weight acrylated polyurethanes (Radcure Corporation's Ebecryl 8800 ); and have weight percent of between about 0.10 and 20.0% of the total coating composition, preferable between about 1.0 and 10%.

Examples of suitable photoinitiators include but are not limited to chlorothioxanthone, isopropylthioxanthone, 4,4'-bisdiethylaminobenzophenone (ethyl Michler's ketone), ethyl-4dimethylaminobenzoate, Ciba Geigy Irgacure 907 and combinations thereof. The photoinitiators comprise between 0.10 and 10.0% of the total coating by weight, preferably 0.40 and 8.0%. In a second preferred embodiment of the present invention, the photopolymeric printing plate includes the single layer photosensitive coating compromising a photopolymerizable combination which includes a photopolymerizable pigment dispersion and a photosensitive lithographic diazonium resin on the electrochemically etched and anodized, silicated aluminum plate of the first embodiment and an additional aqueous, non-photosensitive overcoat applied over the first coating. The additional aqueous, non-photosensitive overcoat functions as a barrier to atmospheric oxygen, retarding the inhibition effects of atmospheric oxygen on the photopolymerization of the single photosensitive coating when the printing plate is exposed either on a non-vacuum frame exposure device (for example a Rachwal or other projection exposure device) or in a vacuum frame exposure device with inadequate vacuum. This aqueous, non-photosensitive overcoat is comprised of water soluble polymers and/or water dispersions of non-water soluble polymers which form an effective barrier to atmospheric oxygen, retarding the inhibition of photopolymerization by atmospheric oxygen. Examples of suitable polymers include but are not limited to polyvinyl alcohol, polyvinylalcohol copolymers, polyvinylacetate and copolymers of polyvinylacetate; styrene-butadiene copolymers; acrylic ester polymers and copolymers; polyvinylchloride and copolymers; polyvinylidene chloride polymers and copolymers. These polymers comprise between 1 and 50% preferably 5 and 30% of the aqueous non-photosensitive coating composition by weight. Additional materials such as surfactants, plasticizers and fillers may also be used in the aqueous, non-photosensitive coating composition to improve coatability and stability of the coating.

While the preferred embodiment of the invention pertains to lithographic printing plates, it also encompasses other photographic elements such as color proofing films wherein the photopolymerizable composition is coated on a transparent substrate such as polyethylene terephthalate, cellulose acetate butyrate, or any other transparent substrate known in the art to be useful in the preparation of color proofing films.

The following non-limiting examples will serve to illustrate the present invention. It will be appreciated that variations in proportions and alternatives in elements of the components of the single layer photosensitive coating comprising a photopolymerizable composition which includes a photopolymerizable pigment dispersion and a photosensitive lithographic diazonium resin and the aqueous, non-photosensitive overcoat will be apparent to those skilled in the art and are within the scope of the present invention.

EXAMPLE 1

The single layer photosensitive coating solution comprising a photopolymerizable combination which includes a photopolymerizable pigment dispersion and photosensitive lithographic diazonium resin is prepared from the following components:

| Component | % by Weight |
| --- | --- |
| ethyleneglycol monomethyl ether | 45.30 |
| ethyleneglycol monoethyl ether | 21.24 |
| dimethyl formamide | 18.00 |
| 51-760002 chip | 2.16 |
| DSO-19 | 0.64 |
| Ebecryl 370 | 2.80 |
| Photomer 4702 | 4.13 |
| Jaylink 106 | 2.00 |
| UCl-100 | 0.67 |
| Quantacure EPD | 1.33 |
| ethyl Michler's ketone | 1.33 |
| oxalic acid dihydrate | 0.40 |
| | 100.00 |

The ethyleneglycol monomethyl ether, ethyleneglycol monoethyl ether and dimethylformamide are all solvents used to dissolve or disperse the other components. The 51-760002 chip is the photopolymerizable pigment dispersion consisting of 60% perylene maroon pigment and 40% Bomar Jaylink 106 photopolymerizable dispersant, an acrylamido substituted cellulose ester. The 51-760002 chip is manufactured by RBH Inc. Bound Brook N.J. DSO-19 is a photosensitive lithographic diazonium resin consisting of the p-toluenesulfonate salt of the condensation product of 4-diazodiphenylamine sulfate and formaldehyde, manufactured by PCAS, Longjumeau, France.

Ebecryl 3701 is a multifunctional acrylate oligomer, being an acrylated bisphenol A epoxy oligomer purchased from Radcure Corporation, Louisville, K.Y. Photomer 4072, a multifunctional acrylate monomer, is a propoxylated trimethylolpropane triacrylate purchased from Henkel, Morristown, N.J., Jaylink 106, an acrylamido substituted cellulose ester purchased from Bomar, Winstead, Conn. is the photopolymerizable binder. UCI-100, Quantacure EPD and ethyl Michler's ketone are the photoinitiators. UCI-100 is chlorothioxanthone purchased from PMC Specialties Group Inc., Cincinnati, OH. Quantacure EPD is ethyl-4-dimethylaminobenzoate purchased from Aceto Chemical Co. Inc., Flushing, N.Y. Ethyl Michler's ketone is 4,4'-bisdiethylaminobenzophenone purchased from Aldrich Chemical Co. Inc., Milwaukee, WI. Oxalic acid dihydrate is employed to adjust the pH of the solution.

In the first embodiment, the above coating solution is applied to an electrochemically etched and anodized, silicated, aluminum substrate by any suitable technique to yield a dry coating weight of $1.05+0.05$ g/m$^2$. The resulting plate is non-tacky and mar resistant. The resulting plate is exposed through suitable negatives and test targets for 14 units on a NuArc FT 26V3UP UltraPlus Flip-Top platemaker equipped with an HT-121 metal halide bulb. A solid step 7 is obtained through a Stouffer 21-step sensitive guide when the thusly exposed plate is developed with the following developing solution.

| Component | % by Weight |
| --- | --- |
| deionized water | 70.03 |
| trisodium ethylenediaminetetraacetic acid | 0.39 |
| tetrapotassium pyrophosphate | 1.80 |
| sodium metabisulfite | 0.78 |
| sodium cumenesulfonate | 15.00 |
| benzyl alcohol | 12.00 |
| | 100.00 |

The imaged areas of the developed plate exhibit excellent resistance to commonly used solvents, as exhibited by the following test. Benzyl alcohol is poured directly in the imaged and developed plate. After five seconds the imaged and developed plate is given 20 vigorous back and forth rubs with a wipe saturated with benzyl alcohol.

The solid step 7 obtained through the Stouffer 21-step sensitivity guide is only stripped back one step to a solid 6. The plate readily picks-up ink in the imaged areas and runs clear in the non-imaged areas when mounted on a lithographic printing press producing in excess of 200,000 impressions with excellent reproduction quality. Stability of the plate is excellent (less that 1-step gain in photospeed and no loss in ease of development) when tested in an accelerated aging test which duplicates one year's storage in ambient conditions.

EXAMPLE 2

This example will demonstrate the effects of a non-photopolymerizable pigment dispersion in a single layer photosensitive coating comprising a photopolymerizable combination which includes a photosensitive lithographic diazonium resin.

The same single layer photosensitive coating solution in example 1 is prepared except that 79R27C chip replaces the 51-760002 chip. 79R27C is a non-photopolymerizable pigment dispersion consisting of 60% perylene maroon pigment and 40% Monsanto Butvat B-98 non-photopolymerizable dispersant, a polyvinylbutyral polymer manufactured by Monsanto, St. Louis, MO. 79R27C is purchased from Penn Color, Doylestown, PA. As in example 1, this coating solution is applied to an electrochemically grained and anodized, silicated aluminum substrate to yield a dry coating weight of $1.05+0.05$ g/m$^2$. The resulting plate is exposed and developed as in example 1. A solid step 7 is obtained through a Stouffer 21-step sensitivity guide as in example 1. When this plate is subjected to the benzyl alcohol test described in example 1 the solid step 7 obtained through the Stouffer 21-step sensitivity guide is stripped back 3 steps to a solid 4 and loss of solid image around the sensitivity guide is also seen, showing significant loss in solvent resistance.

To regain solvent resistance, the amount of Photomer 4072, the multifunctional acrylate monomer in example 2 is increased. Photomer 4072 is a high boiling low viscosity liquid. Solvent resistance comparable to example 1 is achieved only when the amount of Photomer 4072 is increased to three times its original level in example 2. However, the plate prior to exposure is tacky and easily marred. The negative and test targets used to expose the plate adhere to the plate and coating becomes attached to the negative and test targets. The plate shows a 4 step increase in photospeed and is difficult to develop when tested in an accelerated aging test which duplicates one year storage at ambient conditions.

EXAMPLE 3

The preferred second embodiment of the present invention is illustrated in this example. The plate produced in accordance with example 1 is overcoated with the following aqueous, non-photosensitive coating composition.

| Component | % by Weight |
| --- | --- |
| deionized water | 83.19 |
| Gelvatol 40-20 | 5.00 |
| Surfynol 104-A | 0.04 |
| Reichhold 97-756 | 10.77 |
| citric acid | 1.00 |
| | 100.00 |

Gelvatol 40-20 is a polyvinylalcohol polymer purchased from Air Products Inc., Allentown, PA. Surfynol 104-A is a surfactant also purchased from Air Products Inc. Reichhold 97-756 is a carboxylated styrene butadiene copolymer emulsion in water purchased from Reichhold Chemicals Inc., White Plains, NY. Citric acid is employed to adjust the pH of the coating.

The overcoat is applied to the plate of example 1 by a suitable technique to yield a dry coating weight of the overcoat of $0.25+0.05$ g/m$^2$.

To illustrate the function of the overcoat in retarding the inhibition of photopolymerization by atmospheric oxygen the following tests were performed. Plates from example 1 and example 3 were exposed and developed as described in example 1 under normal full vacuum (25 inches of Hg) of the NuArc platemaker. This normal full vacuum condition excludes virtually all atmospheric oxygen during exposure of the plate. Both plates produce a solid step 7 through a Stouffer 21-step sensitivity guide and lose only 1 step to a solid step 6 with the benzyl alcohol test described in example 1. Under normal full vacuum exposure in the NuArc platemaker, both plates exhibit the same photospeed and solvent resistance. Plates from example 1 and example 3 were then similarly exposed and developed except that the vacuum on the NuArc platemaker was reduced to 15 inches of Hg with the vacuum bleed valve so that the exposure occurred in the presence of atmospheric oxygen. The plate from example 1 now produced only a solid step 5 through a Stouffer 21-step sensitivity guide while the plate from example 3 still produced a solid step 7. When subjected to the benzyl alcohol test described in example 1, the plate from example 1 now lost 3 steps to a solid step 2, and shows loss of solid image around the sensitivity guide. The plate from example 3 lost 2 steps to a solid step 5 and shows no loss of solid image around the sensitivity guide. When exposed in the presence of atmospheric oxygen, the unovercoated plate of example 1 shows loss in photospeed and significant loss in solvent resistance of the plate's image, while the overcoated plate of example 3 shows no loss in photospeed and only slight loss in solvent resistance. This data shows that the overcoated plate of example 3 is less effected by the presence of atmospheric oxygen during exposure.

EXAMPLES 4 THROUGH 7

Examples 4 through 7 illustrate that variations in proportions and alternatives in elements of the components of the single photosensitive coating comprising a photopolymerizable combination which includes a photopolymerizable pigment dispersion and a photosensitive lithographic diazonium resin result in photopolymeric printing plates in accordance with the present invention.

EXAMPLE 4

The same single layer photosensitive coating solution in example 1 is prepared except dispersion 300-094 is substituted for the 51-760002 chip. 300-094 is a photopolymerizable pigment dispersion prepared by RBH Inc., Bound Brook, NJ. It consists of 24% phthalo cyanine blue pigment; 38% Ebecryl 3600, a photopolymerizable dispersant consisting of acrylated bisphenol A epoxy oligomer manufactured by Radcure Corporation, Louisville, KY; and Poly Solv DB, diethyleneglycol monobutyl ether, a solvent.

EXAMPLE 5

The DSO-19 in example 1 is replaced by an equimolar amount of 57-D. 57-D is a photosensitive lithographic diazonium resin consisting of the p-chlorobenzenesulfonic acid salt of the condensation product of 4-diazodiphenylamine sulfate and formaldehyde, produced by Anitec Printing Plates, Inc.

EXAMPLE 6

A molar substitution of malic acid is made for oxalic acid in example 1.

EXAMPLE 7

SR-295 is substituted for Photomer 4072 in example 1. SR-295, pentaerythritol tetraacrylate, is a multifunctional acrylate monomer manufactured by Sartomer Co. Inc.

The coating solutions of examples 4 through 7 are applied to an electrochemically etched and anodized, silicated aluminum substrate as in example 1 to yield a dry coating weight of $1.05 + 0.05$ g/m$^2$.

The plates from examples 4 through 7 are exposed, developed and tested for benzyl alcohol resistance as in example 1. The results compared to example 1 are found in Table 1.

TABLE I
FULL VACUUM EXPOSURE

| Example | Solid Step Stouffer 21-Step Sensitivity Guide | Benzyl Alcohol Resistance |
|---|---|---|
| 1 | 7 | - 1 step to solid 6 no solid image stripping |
| 4 | 7 | - 1.5 steps to solid 5.5 no solid image stripping |
| 5 | 8.50 | - 1.5 steps to solid 7 no solid image stripping |
| 6 | 7 | - 1.5 steps to solid 5.5 no solid image stripping |
| 7 | 7.25 | - 1.5 steps to solid 5.75 no solid image stripping |

As seen in table 1, all examples show similar results.

EXAMPLE 8

Daran 8600, a polyvinylidene chloride copolymer emulsion manufactured by W.R. Grace and Co., Lexington, MA., is applied as an aqueous, non-photosensitive overcoat to the plate of example 1 at a dry coating weight of $0.25 + 0.05$ g/m$^2$.

The plates of examples 1, 3 and 8 are exposed at reduced vacuum, developed and tested for resistance to benzyl alcohol as described in example 2. The results are found in table 2.

TABLE 2
REDUCED VACUUM EXPOSURE

| Example | Solid Step Stouffer 21-Step Sensitivity Guide | Benzyl Alcohol Resistance |
|---|---|---|
| 1 | 5 | - 3 to solid 2 solid image strips |
| 3 | 7 | - 2 to solid 5 no solid image stripping |
| 8 | 6.5 | - 2 to solid 4.5 no solid image stripping |

As seen from example 8, variations in proportions and alternatives in elements of the components of the aqueous, non-photosensitive overcoat are in accordance with the present invention.

EXAMPLE 9

As further evidence of the utility of the present invention, the following test was performed.

A single layer photosensitive coating solution comprising a photopolymerizable combination which includes a photopolymerizable pigment dispersion and a photosensitive lithographic diazonium resin is prepared from the following components and identified as coating A.

| Component | % by Weight |
| --- | --- |
| ethyleneglycol monomethyl ether | 65.42 |
| ethyleneglycol monoethyl ether | 16.82 |
| dimethylformamide | 11.21 |
| 79R84C chip | 1.00 |
| Diazo TG-13 | 0.54 |
| Ebecryl 3701 | 1.16 |
| Photomer 4072 | 1.70 |
| Jaylink 106 | 0.83 |
| Irgacure 907 | 0.88 |
| ITX | 0.28 |
| Sandoray 1000 | 0.04 |
| C.I. Acid Yellow 36 | 0.12 |
| | 100.00 |

The ethyleneglycol monomethyl ether, ethyleneglycol monoethyl ether, dimethylformamide, Ebecryl 3701, Photomer 4072 and Jaylink 106 have been described in example 1. 79R84C chip is a photopolymerizable pigment dispersion made by Penn Color Inc., Doylestown, PA. It consists of 60% perylene maroon pigment; 20% photopolymerizable dispersant Sartomer 9700, an acrylated polyurethane oligomer manufactured made by Sartomer Inc. and 20% non-photopolymerizable dispersant Butvar B-98, a polyvinylbutyral polymer made by Monsanto, St. Louis, MO. Diazo TG-13 is a photosensitive lithographic diazonium resin consisting of the p-toluenesulfonate salt of the condensation product of 85 mole % 4-diazo-3-methoxy-diphenylamine sulfate and 15 mole % 4-diazodiphenylamine sulfate with formaldehyde condensed in sulfuric acid. Irgacure 907, ITX and Sandoray 1000 are photoinitiators. Irgacure 907 is purchased from Ciba-Geigy, Ardsley, NY. ITX is isopropylthioxanthanone purchased from Biddle Sawyer. Sandoray 1000 is purchased from Sandoz Chemical Co. Inc. C.I. Acid Yellow 36 produces a visible image after exposure and is purchased from Atlantic Industries.

A is coated on an electrochemically etched and anodized, silicated aluminum substrate by any suitable method to yield a dry coating weight of $0.85 \pm 0.05$ g/m$^2$.

An aqueous, non-photosensitive overcoat is applied over A by a suitable technique to yield a dry coating weight of $0.15 \pm 0.05$ g/m$^2$. The overcoat consists of the following:

| Component | % by Weight |
| --- | --- |
| deionized water | 75.60 |
| Gelvatol 40-20 | 1.88 |
| Surfynol 104-A | 0.02 |
| Rhoplex HA-16 | 22.50 |
| | 100.00 |

All components except for Rhoplex HA-16 are described in example 3. Rhoplex HA-16 is an acrylic emulsion polymer manufactured by Rohm & Haas, Philadelphia, PA. Thus, a photopolymeric printing on electrochemically etched and anodized, silicated aluminum consisting of a single layer photosensitive coating comprising a photopolymerizable combination which includes a photopolymerizable pigment dispersion and a photosensitive lithographic diazonium resin overcoated with an aqueous, non-photosensitive overcoat is produced in accordance with the present invention. This plate is identified as plate A.

The same coating solution as A is prepared except that 79R27C chip, a non-photopolymerizable pigment dispersion is substituted for the photopolymerizable pigment dispersion 79R84C chip. This coating is identified as B. 79R27C chip has been described in example 2.

B is coated on the same electrochemically etched and anodized, silicated aluminum substrate as A to yield a dry coating weight of $0.85 \pm 0.05$ g/m$^2$.

The same aqueous, non-photosensitive overcoat applied over A is also applied over B at a dry coating weight of $0.15 \pm 0.05$ g/m$^2$. Thus, a photopolymeric printing the same as A is produced except that the pigment dispersion employed is non-photopolymerizable. This plate is identified as plate B.

Plates A and B are exposed and developed as described in example 1 except that exposure is reduced to 10 units to obtain a solid step 5 through a Stouffer 21-step sensitivity guide. The plates are mounted side by side on a Didde-Glazer web-feed offset press and run under conditions to accelerate wear of the plate (overpacking, coarse ground ink, coarse paper stock). Both plates print solid step 6 on the Stouffer 21-step sensitivity guide imaged on the plates and clean non-image areas on initial roll-up. After 30,000 impressions, plate B begins to show signs of wear as seen by its printing only solid step 5. Similar wear is not seen on plate A until 40,000 impressions. At the conclusion of the test at 60,000 impressions, plate B now only prints a solid step 3, while A continues to print a solid step 5. Further indication of the durability of plate A is seen in the 2% dots and micron rings imaged on the plates through UGRA plate control wedge 1982.

Plate B ceases to print the 2% dot after 40,000 impressions while plate A continues to print the 2% dot at 60,000 impressions, the end of the test. Plate B ceases to print 6 micron rings at 40,000 impressions. Plate A continues to print 6 micron rings at 60,000 impressions, the end of the test.

We claim:
1. A method for preparing a photographic element which comprises, forming a light sensitive, photopolymerizable composition which comprises an admixture of:

a.) a substantially homogeneous pigment composition, which pigment composition comprises pigment particles which are substantially pre-encapsulated by a barrier material, which barrier material comprises one or more photopolymerizable monomer, oligomer or polymer components capable of being photopolymerized and which resists de-encapsulation when in admixture with the other components of the photosensitive composition, said pigment composition being present in an amount sufficient to substantially uniformly color the photosensitive composition; and b.) at least one photopolymerizable monomer, oligomer or polymer binder in an amount sufficient to form a substantially uniform photopolymerizable composition; and c.) at least one photoinitiator in an amount sufficient to effect photopolymerization of the barrier material and the photopolymerizable monomer, oligomer or polymer binder upon exposure to sufficient actinic radiation; and d. at least one diazonium compound in an amount sufficient to form a light sensitive composition; and coating a substrate with a substantially uniform layer of said photopolymerizable composition in the absence of any other light sensitive composition on said substrate.

2. The method of claim 1 wherein said pigment composition comprises from about 20% to about 80% by weight of the pigment composition of at least one organic or inorganic pigment and from about 20% to about 80% by weight of the pigment composition of said barrier material.

3. The method of claim 1 wherein said pigment composition is present in the photopolymerizable composition in an amount of from about 0.1% and about 30% by weight of the photopolymerizable composition.

4. The method of claim 1 wherein said photopolymerizable monomer, oligomer or polymer binder is present in an amount of from about 0.1% to about 60% by weight of the photopolymerizable composition.

5. The method of claim 1 wherein said photoinitiator is present in the photopolymerizable composition in an amount of from about 0.10% to about 10.0% by weight of the photopolymerizable composition.

6. The method of claim 1 wherein said diazonium compound comprises from about 0.05% to about 10% by weight of the photopolymerizable composition.

7. The method of claim 1 wherein said photopolymerizable barrier material comprises a combination of at least one photopolymerizable monomer, oligomer, or polymer and at least one non-photopolymerizable polymer.

8. The method of claim 7 wherein the ratio of photopolymerizable monomer, oligomer, or polymer to non-photopolymerizable polymer in the barrier is from about 4:1 to about 1:4.

9. The method of claim 1 wherein said photopolymerizable binder comprises from about 0.1% and about 20% by weight of at least one photopolymerizable multifunctional acrylate oligomer; and from about 0.1% and about 20% by weight of at least one photopolymerizable multifunctional acrylate monomer; and from about 0.1% and about 20% by weight of at least one photopolymerizable polymer based on the weight of the photopolymerizable composition.

10. The method of claim 9 wherein said multifunctional acrylate oligomer is selected from the group consisting of acrylated epoxies, acrylated polyurethanes and acrylated polyesters.

11. The method of claim 9 wherein said multifunctional acrylate monomer is selected from the group consisting of trimethylolpropane triacrylate, trimethylolpropane propoxylate triacrylate, trimethylolpropane ethoxylate triacrylate, and pentaerythritol tetraacrylate.

12. The method of claim 9 wherein said photopolymerizable polymer is selected from the group consisting of acrylamido substituted cellulose esters, acrylated polyurethanes, acrylated polyvinylbutyral and acrylamido substituted polyvinylbutyral.

13. The method of claim 1 wherein said diazonium compound comprises salts of the condensation product of at least one monomeric organic diazonium compound with at least one active methylene group containing compound condensed in acid.

14. The method of claim 1 wherein said substrate is transparent.

15. The method of claim 1 wherein the substrate comprises aluminum.

16. The method of claim 15 wherein the aluminum substrate has been prepared by one or more treatments selected from the group consisting of graining, electrochemical etching, anodizing and hydrophilizing.

17. The method of claim 16 wherein the hydrophilizing is conducted with a silicating treatment.

18. The method of claim 1 further comprising applying a non-photosensitive oxygen barrier overcoat layer over said photopolymerizable composition layer.

19. The method of claim 18 wherein said overcoat layer comprises an aqueous solution of at least one water soluble polymeric material.

20. The method of claim 18 wherein said overcoat layer comprises an aqueous dispersion of at least one non-water soluble polymeric material.

21. The method of claim 18 wherein said overcoat layer comprises a combination of an aqueous dispersion of at least one non-water soluble polymer material and an aqueous solution of at least one water soluble polymeric material.

22. The method of claim 17 wherein i.) the pigment composition is present in the photopolymerizable composition in an amount of from about 0.1% and about 30% by weight of the photopolymerizable composition; and ii.) the photopolymerizable monomer, oligomer or polymer binder is present in an amount of from about 0.1% and about 60% by weight of the photopolymerizable composition; and iii.) the photoinitiator is present in the photopolymerizable composition in an amount of from about 0.10% to about 10.0% by weight of the photopolymerizable composition; and iv.) the diazonium compound comprises from about 0.05% and 10% by weight of the photopolymerizable composition; and v.) the photopolymerizable barrier comprises a combination of at least one photopolymerizable monomer, oligomer, or polymer and at least one non-photopolymerizable polymer wherein the ratio of photopolymerizable monomer, oligomer, or polymer to non-photopolymerizable polymer in the barrier is from about 4:1 to about 1:4; and vi.) the photopolymerizable binder comprises from about 0.1% and about 20% by weight of at least one photopolymerizable multifunctional acrylate oligomer; and from about 0.1% and about 20% by weight of at least one photopolymerizable multifunctional acrylate monomer; and from about 0.1% and about 20% by weight of at least one photopolymerizable polymer based on the weight of the photopolymerizable composition; and vii.) wherein said multifunctional acrylate oligomer is selected from the group consisting of acrylated epoxies, acrylated polyurethanes and acrylated polyesters; and viii.) wherein said multifunctional acrylate monomer is selected from the group consisting of trimethylolpropane triacrylate, trimethylolpropane propoxylate triacrylate, trimethylolpropane ethoxylate triacrylate, and pentaerythritol tetraacrylate; and ix.) wherein said photopolymerizable polymer is selected from the group consisting of acrylamido substituted cellulose esters, acrylated polyurethanes, acrylated polyvinylbutyral and acrylamido substituted polyvinylbutyral; and x.) wherein said diazonium compound comprises salts of the condensation product of at least one monomeric organic diazonium compound with at least one active methylene group containing compound condensed in acid; and xi.) wherein said single photopolymerizable composition layer further comprises a non-photosensitive oxygen barrier overcoat layer over said photopolymerizable composition, which overcoat layer comprises one or more components selected from the group consisting of an aqueous dispersion of a non-water soluble polymer material and an aqueous solution of at least one water soluble polymeric material.

23. A method for forming an image which comprises
I. preparing a photographic element by forming a light sensitive, photopolymerizable composition which comprises an admixture of:
  a.) a substantially homogeneous pigment composition, which pigment composition comprises pigment particles which are substantially pre-encapsulated by a barrier material, which barrier material comprises one or more photopolymerizable monomer, oligomer or polymer components capable of being photopolymerized and which resists de-encapsulation when in admixture with the other components of the photosensitive composition, said pigment composition being present in an amount sufficient to substantially uniformly color the photosensitive composition; and
  b.) at least one photopolymerizable monomer, oligomer or polymer binder in an amount sufficient to form a substantially uniform photopolymerizable composition; and
  c.) at least one photoinitiator in an amount sufficient to effect photopolymerization of the barrier material and the photopolymerizable monomer, oligomer or polymer binder upon exposure to sufficient actinic radiation; and
  d.) at least one diazonium compound in an amount sufficient to form a light sensitive composition; and
II. coating a subtrate with a substantially uniform layer of said photopolymerizable composition in the absence of any other light sensitive composition on said substrate; and
III. imagewise exposing the layer to actinic radiation; and
IV. removing the imagewise unexposed, non-image portions of the layer of photopolymerizable composition with a developing solution.

* * * * *